(12) United States Patent
Yang et al.

(10) Patent No.: US 8,546,785 B2
(45) Date of Patent: Oct. 1, 2013

(54) MEMRISTIVE DEVICE

(75) Inventors: Jianhua Yang, Palo Alto, CA (US);
Feng Miao, Mountain View, CA (US);
Wei Wu, Palo Alto, CA (US);
Shih-Yuan Wang, Palo Alto, CA (US);
R. Stanley Williams, Portola Valley, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 624 days.

(21) Appl. No.: 12/751,977

(22) Filed: Mar. 31, 2010

(65) Prior Publication Data

US 2011/0240951 A1 Oct. 6, 2011

(51) Int. Cl.
*H01L 27/24* (2006.01)

(52) U.S. Cl.
USPC .......... 257/5; 257/2; 257/4; 257/E45.002; 365/148; 365/157; 365/158; 365/163

(58) Field of Classification Search
USPC .......... 257/2, 4, 5, E27.004, E45.002, 532; 365/148, 157, 158, 163; 438/148, 157, 158, 438/163
See application file for complete search history.

(56) References Cited

U.S. PATENT DOCUMENTS

| | | | |
|---|---|---|---|
| 4,845,533 A | 7/1989 | Pryor et al. | |
| 6,458,621 B1 | 10/2002 | Beck | |
| 6,855,647 B2 | 2/2005 | Beck et al. | |
| 8,294,132 B2* | 10/2012 | Miao et al. | 257/3 |
| 2003/0143790 A1 | 7/2003 | Wu | |
| 2003/0173612 A1 | 9/2003 | Krieger et al. | |
| 2004/0178401 A1 | 9/2004 | Ovshinsky et al. | |
| 2007/0228414 A1* | 10/2007 | Kumar et al. | 257/183 |
| 2007/0252131 A1* | 11/2007 | Tong et al. | 257/9 |
| 2008/0079029 A1 | 4/2008 | Williams | |
| 2008/0090337 A1 | 4/2008 | Williams | |
| 2009/0258135 A1* | 10/2009 | Kumar et al. | 427/122 |
| 2010/0006811 A1* | 1/2010 | Xu et al. | 257/2 |

OTHER PUBLICATIONS

Kreupl, F. et al, "Carbon-Based Resistive Memory", 2008, Proceedings of IEEE Electron Devices Meeting, pp. 521-524.*
Choi, B.J., et al., "Resistive switching mechanism of TiO2 thin films grown by atomic-layer deposition", Journal of Applied Physics 98, (2005), pp. 033715-1-033715-10.
Rothschild, A. et al.,"Electronic and transport properties of reduced and oxidized nanocrystalline TiO2 Films", Applied Physics Letters, vol. 82, No. 4, Jan. 27, 2003, pp. 574-576.
Blanc, Joseph, et al., "Electrocoloration in SrTiO3: Vacancy Drift and Oxidation-Reduction of Transition Metals", Physical Review B, vol. 4, No. 10, Nov. 15, 1971, pp. 3548-3557.
Knauth, P., "Defect and transport properties of nonocrystalline ceramics and thin films", J. Solid State Electrochem (2002), vol. 6, pp. 165-171.
Weibel, A. et al., "Electrical properties and defect chemistry of anatase (TiO2)", Solid State Ionics 177 (2006), pp. 229-236.

(Continued)

*Primary Examiner* — Daniel Whalen
*Assistant Examiner* — Suberr Chi

(57) ABSTRACT

A memristive device includes a first electrode and a second electrode crossing the first electrode at a non-zero angle. An active region is disposed between the first and second electrodes. The active region has defects therein. Graphene or graphite is disposed between the active region and the first electrode and/or between the active region and the second electrode.

12 Claims, 4 Drawing Sheets

(56) References Cited

OTHER PUBLICATIONS

Dearnaley, G., et al., "Electrical phenomena in amorphous oxide films", Rep. Prog. Phys., 1970, 33, pp. 1129-1191.

Jeong, Doo Seok, et al., "Impedance spectroscopy of TiO2 thin films showing resistive switching", Applied Physics Letters 89, 2006, pp. 082909-1-082909-3.

Meijer, G. I., "Who Wins the Nonvolatile Memory Race?", Science, vol. 319, Mar. 21, 2008, pp. 1625-1626.

Sawa, Akihito, "Resistive switching in transition metal oxides", materialstoday, vol. 11, No. 6, Jun. 2008, pp. 28-36.

Strukov, Dmitri B., et al., "The missing memristor found", Nature Letters, vol. 453, May 1, 2008, pp. 80-83.

Strukov, Dmitri B., et al., "Exponential ionic drift: fast switching and low volatility of thin-film memristors", Applied Physics A, Nov. 28, 2008, 5 pgs.

Waser, Rainer, et al., "Nanoionics-based resistive switching memories", nature materials, vol. 6, Nov. 2007, pp. 833-840, www.nature.com/naturematerials.

Yang, J. J., et al., "Memristive switching mechanism for metal/oxide/metal nanodevices", nature nanotechnology, vol. 3, Jul. 2008, pp. 429-433.

Liang et al., "Graphene Transistors Fabricated via Trans-Printing in Device Active-Areas on Large Wafer", Nano Letters, 2007, vol. 7, No. 12, pp. 3840-3844.

Yang et al., "The Mechanism of Electroforming of Metal Oxide Memristive Switches", Nanotechnology 20 (2009), 215201, pp. 1-9.

Bunch et al., "Impermeable Atomic Membranes from Graphene Sheets", Nano Letters, 2008, vol. 8, No. 8, pp. 2458-2462.

Yang et al., "Memristive Device", PCT Patent Application S.N. PCT/US09/050433 filed Jul. 13, 2009 (16 pages).

\* cited by examiner

— MEMRISTIVE DEVICE

STATEMENT OF GOVERNMENT INTEREST

This invention was made with government support under Contract No. 2008-0911510-002. The government has certain rights in the invention.

BACKGROUND

The present disclosure relates generally to memristive devices.

Nanometer-scale crossed-wire switching devices have previously been reported that can be reversibly switched. Such devices have been used to construct crossbar circuits and provide a promising route for the creation of ultra-high density nonvolatile memory and systems with dynamic/synaptic logic. A latch (which is a component for logic circuits and for communication between logic and memory) has been fabricated from a series connection of crossed-wire switches. New logic families, constructed entirely from crossbar arrays of switches or as hybrid structures composed of switches and transistors, have also been described. These new logic families have the potential to dramatically increase the computing efficiency of CMOS circuits.

BRIEF DESCRIPTION OF THE DRAWINGS

Features and advantages of embodiments of the present disclosure will become apparent by reference to the following detailed description and drawings, in which like reference numerals correspond to the same or similar, though perhaps not identical, components. For the sake of brevity, reference numerals having a previously described function may or may not be described in connection with subsequent drawings in which they appear.

DETAILED DESCRIPTION

Figure 1:
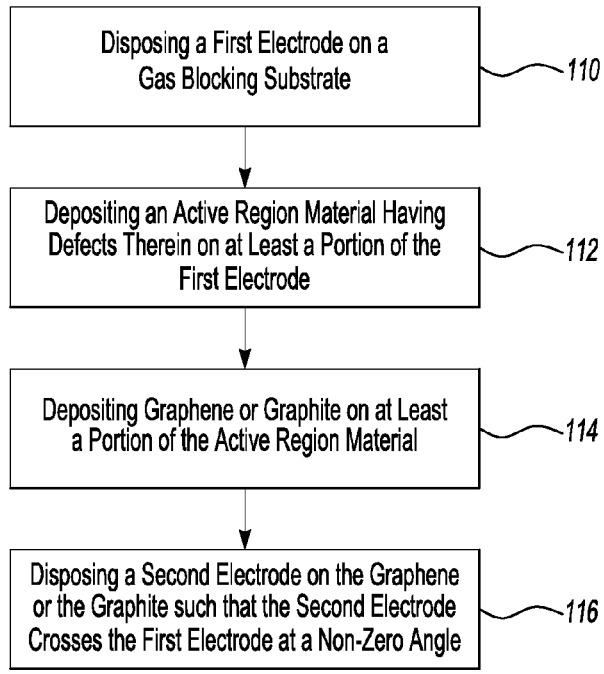
FIG. 1 is a flow diagram illustrating an embodiment of a method for making an embodiment of a memristive device.

Memristor device operation is believed to rely on the motion of mobile charged species (i.e., defects) through an active region (i.e., switching material) between two electrodes. In a vertically oriented structure, the active region is located between the edges of the top and bottom electrodes or other barrier layers positioned adjacent such top and bottom electrodes. It is believed that gas interaction occurs between the active region material and the external environment during electrical switching. More specifically, when under bias and during switching (between ON and OFF states), material of the active region undergoes an electrochemical reaction and is released in the form of gas, which causes the device to become more and more conductive. Such enhanced conductivity can lead to device failure. Additionally, under zero bias, the device resistance may drift towards a higher value due to the absorption of gas from the environment into the active region, which can lead to volatility of the memory in the device. The addition of graphene or graphite to predetermined areas of the device can sufficiently isolate the active region from the environment, thereby preventing or substantially reducing deleterious gas interactions. The graphene or graphite has a crystalline structure which is impermeable to a number of gases, including oxygen, nitrogen and sulfur gases, and thus functions as a barrier to both gas release from, and gas absorption into, the active region. The memristive devices disclosed herein including graphene or graphite have improved endurance, stability, and non-volatility.

As used herein, the term "graphene" refers to a one-atom-thick planar layer of $sp^2$-bonded carbon atoms that are configured in a two-dimensional honeycomb crystal lattice. Also as used herein, the term "graphite" refers to multiple layers of graphene, where the number of graphene monolayers ranges from two to twenty. As such, any device includes a maximum graphite thickness of about 8 nm. Since the graphite is composed of graphene, the graphite also has a crystalline structure. The crystalline structures are ordered, and thus the atoms are arranged in an orderly repeating pattern. Both the graphene and graphite are very thin, and thus do not add bulk to the device. Still further, the graphene and graphite used in the embodiments disclosed herein have few or no defects (i.e., large cluster boundaries or pores) therein. As such, the crystalline structure enhances the gas blocking function of the graphene/graphite. Unlike amorphous carbon, graphene/graphite does not have large cluster boundaries or pores, and thus is able to block gas in spite of the thinness of such materials.

Furthermore, the terms "disposed on", "deposited on", or the like are broadly defined herein to encompass a variety of divergent connected arrangements and assembly techniques. These arrangements and techniques include, but are not limited to (1) the direct connection between one component and another component with no intervening components therebetween; and (2) the connection of one component and another component with one or more components therebetween. In some instances, one component disposed or deposited on the other component is somehow in operative communication with the other component (notwithstanding the presence of one or more additional components therebetween).

Each of the memristive devices (also referred to herein as a memristor) disclosed herein includes two electrodes (respectively labeled 12 and 14 in FIGS. 2 and 4-7) having a single cross-point/junction (labeled J) therebetween. It is to be understood that the devices shown in the figures are generally constructed vertically, and thus the electrodes are bottom and top electrodes, respectively.

Figure 2:
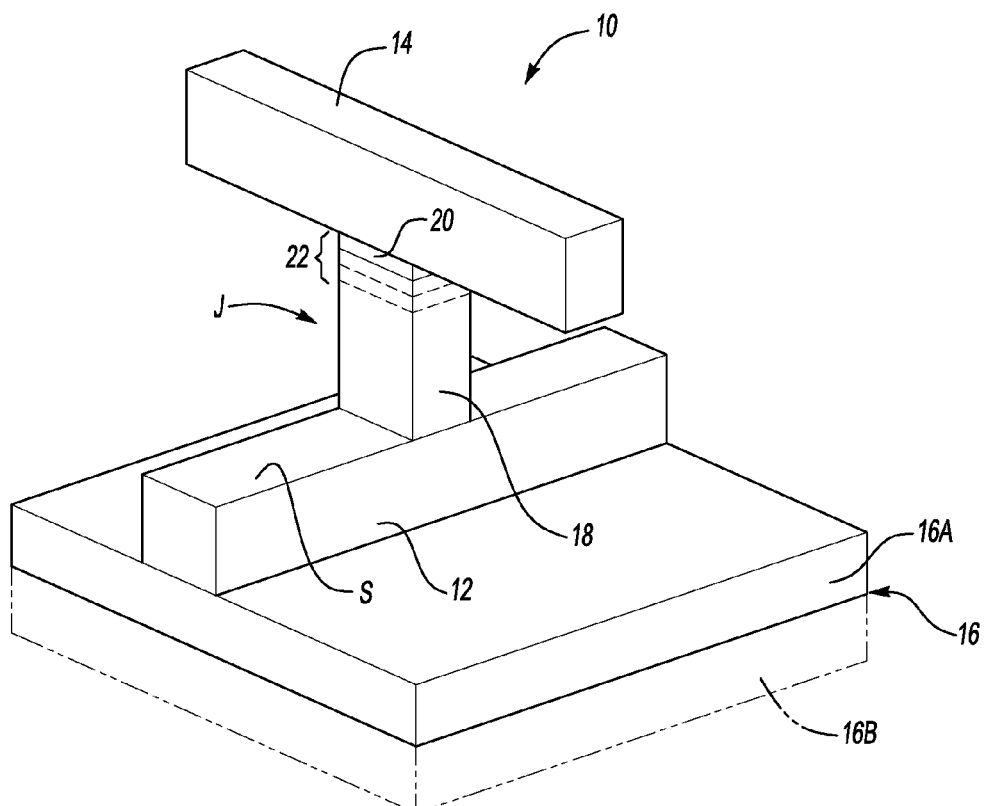
FIG. 2 is a semi-schematic, perspective view of an embodiment of the memristive device formed, for example, via the embodiment of the method shown in FIG. 1.

FIG. 1 illustrates an embodiment of a method for forming the embodiment of the memristive device 10 shown in FIG. 2. As such, FIGS. 1 and 2 will now be referred to together.

As shown at reference numeral 110 of FIG. 1, the electrode 12 is disposed on a gas blocking substrate 16 (i.e., one or more stiff inorganic solid layers of material). Non-limiting examples of such gas-blocking substrates 16 include a silicon wafer having a silicon dioxide layer disposed thereon, aluminum oxide, strontium titanate, magnesium oxide, gallium nitride, aluminum nitride, gallium arsenide, germanium, other non-oxide semiconductors or insulators, and combinations thereof. A combination of substrates is shown in FIG. 2, and includes two or more layers $16_A$, $16_B$ of such substrate materials. This particular substrate 16 is capable of functioning as a suitable gas blocking layer (i.e., prohibits gas from escaping from the active region through the bottom of the device 10). The substrate 16 may also be used to provide mechanical support for the device 10.

The electrode 12 may be formed of any suitable conductive material (e.g., gold, platinum, tungsten, copper, titanium nitride, tantalum nitride, etc.), and may have any suitable thickness (e.g., ranging from about 5 nm to about 30 nm). The electrode 12 may be fabricated using conventional techniques, such as photolithography or electron beam lithography, or by more advanced techniques, such as imprint lithography.

Since the gas blocking substrate 16 is used in this embodiment, graphene or graphite may not be included between the electrode 12 and the active region 18. As such, the material making up the active region 18 may be deposited directly on the surface S of the electrode 12, as shown at reference numeral 112 in FIG. 1.

The active region 18 is made up of an oxide, nitride, or sulfide having defects (e.g., oxygen vacancies, nitride vacancies, or sulfide vacancies, respectively) therein. Non-limiting examples of such materials include $TiO_2$ and $TiO_{2-x}$ (where $0<x<2$), $NiO_2$ and $NiO_{2-x}$ (where $0<x<2$), $GaN$ and $GaN_{1-x}$ (where $0<x<1$), $ZrO_2$ and $ZrO_{2-x}$ (where $0<x<2$), $HfO_2$ and $HfO_{2-x}$ (where $0<x<2$), or $SrTiO_3$ and $SrTiO_{3-x}$ (where $0<x<3$), or $Cu_2S$ and $CuS_{2-x}$ (where $0<x<1$), or copper sulfides, where the ratio of Cu to S in the non-vacancy rich portion can range from 0.5 to 2 (i.e., from $CuS_2$ to $Cu_2S$) and where the ratio of Cu to S in the vacancy rich portion can range, respectively, from $CuS_{2-x}$ (where $0<x<2$) to $Cu_2S_x$ (where $0<x<1$). The defects are generally introduced or formed at an interface near one of the electrodes 12 or at an interface near subsequently disposed graphene 20 or graphite 22 (i.e., a portion of active region 18 is rich in vacancies (e.g., $TiO_{2-x}$)). The other of these interfaces (e.g., near the graphene 20 or graphite 22, or near the electrode 12) remains substantially void of defects (i.e., another portion of the active region 18 has little or no defects therein, and as such, has a resistivity of more than $10^4$ ohm-cm (e.g., $TiO_2$)). In the final device 10, upon application of a suitable voltage for ON switching (e.g., to a low resistance state), the defects drift towards whichever interface is substantially void of defects, thereby creating localized conductance channels across the active region 18. For OFF switching, the opposite voltage polarity is applied, and the defects retreat from that interface to switch the device 10 to a high resistance state.

Suitable deposition techniques for the oxide, nitride, or sulfide material include conventional physical and chemical techniques, including evaporation from a heated source, such as a filament or a Knudsen cell, electron beam (i.e., e-beam) evaporation from a crucible, sputtering from a target, other forms of evaporation, chemical vapor deposition (CVD), molecular beam deposition, atomic layer deposition, pulse laser deposition, or various other forms of chemical vapor or beam growth from reactive precursors. Appropriate deposition or growth conditions, such as speed and temperature, may be selected to achieve the desirable chemical composition and local atomic structure desired for the material 18.

The defects may be introduced after the material has been deposited, or during deposition of the oxide, nitride, or sulfide material. In one non-limiting example, dopant initiators may be diffused from a region or source into the oxide, nitride, or sulfide material, where they react with a portion (e.g., a few nanometers or less) of the oxide, nitride, or sulfide material. This chemical reaction forms the defects at the interface between the remaining oxide, nitride, or sulfide material and the electrode 12 or graphene 20 or graphite 22 (depending, at least in part, from where the dopant initiators are diffused). Non-limiting examples of dopants that result from the chemical reaction include interstitials, vacancies or other charged impurities. Such mobile dopants are positively or negatively charged. In one non-limiting example, titanium (e.g., a suitable dopant initiator) may diffuse through a platinum electrode and react with the active region material, e.g., titanium dioxide.

This chemical reaction causes the reduction of a portion of the metal oxide, resulting in the formation of a $TiO_{2-x}$ area at the interface between the remaining titanium dioxide and the platinum electrode (e.g., electrode 12). This $TiO_{2-x}$ area has a small deficit of oxygen atoms in the crystal structure, and the sites (where the missing oxygen atoms would be) are positively charged vacancies, or defects/mobile dopants.

In another non-limiting example, the active region 18 is made up of layers formed with a precise defect concentration so that the entire active region 18 exhibits a desirable defect concentration profile when the device 10 is in an OFF state. An example of the formation of such an active region 18 is described in International Patent Application No. PCT/US09/050,433, filed Jul. 13, 2009, and is incorporated herein by reference in its entirety. In this embodiment, the layers of the active region 18 are formed via atomic layer deposition (ALD), which involves sequential pulsing of different chemical precursor vapors, both of which form about one atomic layer per pulse. By varying the temperature continuously from one cycle (layer) to the next, one can achieve a desirable continuous defect gradient throughout the active region 18.

Using ALD, all or a portion of the surface S of the electrode 12 is exposed to the pulse of a metal precursor, and then is exposed to the pulse of an oxygen precursor, a nitrogen precursor, or a sulfur precursor. The metal precursor is selected so that upon reacting with the oxygen, nitrogen, or sulfur precursor, a metal oxide layer, a metal nitride layer, or a metal sulfide layer having a predetermined defect concentration is formed. In one embodiment, the metal precursor is a titanium precursor and has the chemical formula of $C_{16}H_{40}N_4Ti$ (tetrakis(diethylamido)titanium(IV)). It is believed that other titanium precursors, such as tetrakis(dimethylamido)titanium(IV) and titanium(IV) isopropoxide, may also be used. It is to be understood that precursors of nickel, gallium, zirconium, or hafnium, or precursors of strontium and titanium may also be used.

After the pulse of metal precursor, at least the metal, having some dangling groups attached thereto, is deposited on the surface S of the electrode 12. It is to be understood that the oxygen precursor, nitrogen precursor, or sulfur precursor pulse that is pulsed into the reaction chamber after the metal precursor, is selected based upon whether it is desirable to form a metal oxide, a metal nitride, or a metal sulfide. When a metal oxide layer is to be formed, non-limiting examples of suitable oxygen precursors include water, oxygen plasma, or ozone. When a metal nitride layer is to be formed, non-limiting examples of suitable nitrogen precursors include $NH_3$ or $N_2/H_2$. When a metal sulfide layer is formed, one non-limiting example of suitable sulfur precursors includes $H_2S/N_2$. The oxygen precursor, nitride precursor, or sulfide precursor reacts with the dangling groups to form the metal oxide, metal nitride, or the metal sulfide, respectively. It is to be understood that one metal precursor pulse and one oxygen/nitrogen/sulfur precursor pulse makes up a single cycle and forms a single layer of the active region 18. The pulse combinations may be repeated as many times as is desirable to achieve the desirable thickness of the active region 18. In one embodiment, the thickness ranges from about 2 nm to about 200 nm.

As shown in FIG. 2, the active region 18 may be established on a portion of the surface S of electrode 12. This is accomplished using a selective deposition process. Generally, when selective deposition is used to establish the materials on the portion of the electrode surface S, the materials are positioned such that they are or will be located in the junction J between the electrodes 12, 14. It is to be understood however, that the materials may also be deposited along the entire surface S (see, e.g., FIG. 7). In such instances, the portion of the materials at the junction J form the active region 18, and the materials positioned adjacent to the junction J remain inactive, as no voltage is applied therebetween.

Once the active region 18 is formed, graphene 20 or graphite 22 is deposited on at least a portion of the active region 18 that is positioned in the junction J (see reference numeral 114 in FIG. 1). The graphene 20 or graphite 22 may be deposited via a growth process or via a transfer nanoimprinting process. A non-limiting example of a suitable growth process is epitaxial growth. Such a growth process may be repeated to achieve several monolayers of graphene 20 (i.e., graphite 22). A non-limiting example of a suitable transfer printing process is described in Liang, et al., "Graphene Transistors Fabricated via Transfer-Printing in Device Active-Areas on Large Wafer", *Nano Letters*, 2007. Such a process generally involves pressing a stamp into a graphite substrate. The stamp has protrusion(s) at least i) the size of the active region 18 (or other surface) to be covered with the graphene 20 or graphite 22, and ii) a thickness so that either graphene (a monolayer) or graphite (multiple layers) is cut from the graphene substrate. In one example, protrusions with a 50 micron thickness transfers graphite of about 4 monolayers. The protrusion(s) may be coated with a transferring layer (e.g., a resin-based material) which functions to adhere the graphene or graphite during cutting and exfoliating, but release the graphene or graphite during printing. The stamp cuts out and attached a piece of graphene or graphite via the protrusion edge, and separating the stamp from the graphite substrate exfoliates the cut graphene or graphite. A microscope or other suitable device may be used to inspect the quality of the cut graphene or graphite. When the cut graphene or graphite is of suitable quality (e.g., does not have large cluster boundaries or pores), the cut portion may then be transferred to (printed on) the active region 18. The temperature during printing may be elevated to increase the bonding between the cut graphene or graphite and the active region 18.

It is to be understood that a fixing layer may be used to adhere the cut graphene or graphite to the active region 18 during printing. The addition of such a layer will depend, at least in part, upon the material used for the active region 18. A fixing layer may be desirable when the cut graphene or graphite has a stronger bond with the stamp than with the selected active region 18 material. Such a fixing layer will be selected so that it will form a stronger bond with the cut graphene or graphite than the bond between the graphene or graphite and the stamp. In one non-limiting example, the fixing layer is formed of silicon dioxide.

Transferring the cut graphene or graphite to the active region 18 may also be accomplished by applying an electrical field between the graphene/graphite stamp and the active region 18 when the two are in contact. The electrical static force will help to peel one or a few layers (i.e., graphene or graphite) from the stamp to transfer such layer(s) to the active region 18 material.

After the graphene 20 or graphite 22 is in place on the active region 18, the top/second electrode 14 is positioned thereon at some desirable angle that is non-parallel to the orientation of the bottom/first electrode 12 (see, e.g., reference numeral 116 of FIG. 1). The second electrode 14 may be the same material as, or a different material than the first electrode 12, and may be established via the same or a different technique than that used to establish the first electrode 12. In one example, the second electrode 14 is evaporated on the graphene 20 or graphite 22 with an electron beam evaporator. It is to be understood that both the material and the thickness of the electrodes 12, 14 may be varied as is desirable to achieve one or more particular device properties. Although individual electrodes 12, 14 in the figures are shown with square or rectangular cross-sections, wires may also have circular, elliptical, or more complex cross-sections. The electrodes 12, 14 may also have many different widths or diameters and aspect ratios or eccentricities.

Figure 3:
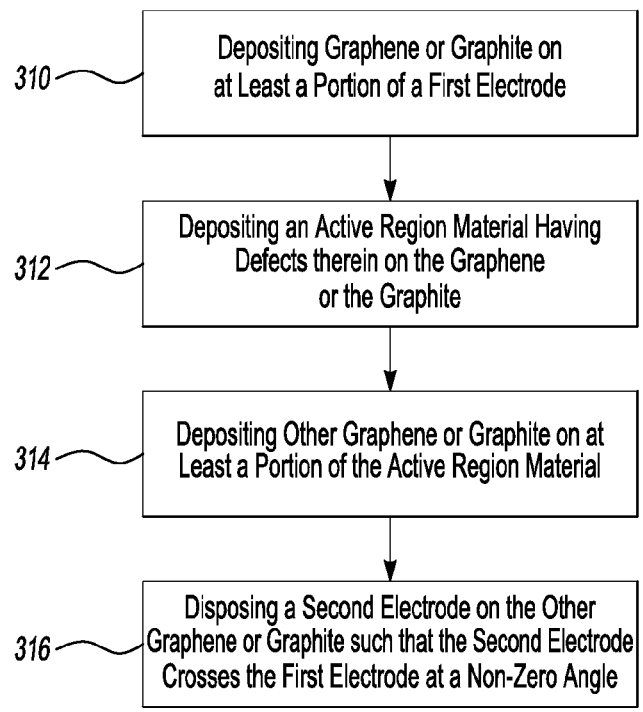
FIG. 3 is a flow diagram illustrating another embodiment of a method for making another embodiment of a memristive device.
Figure 4:
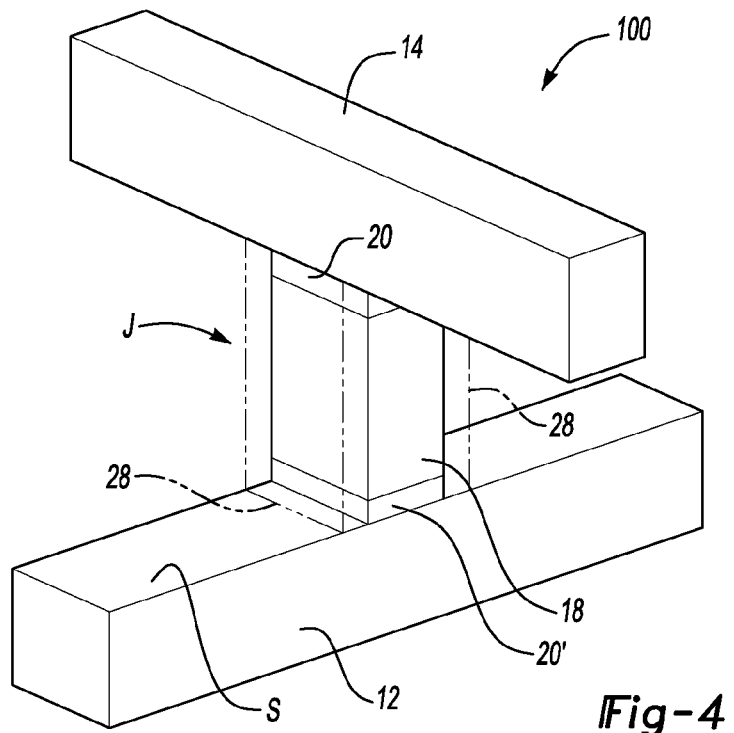
FIG. 4 is a semi-schematic, perspective view of another embodiment of the memristive device formed, for example, via the embodiment of the method shown in FIG. 3.
Figure 5:
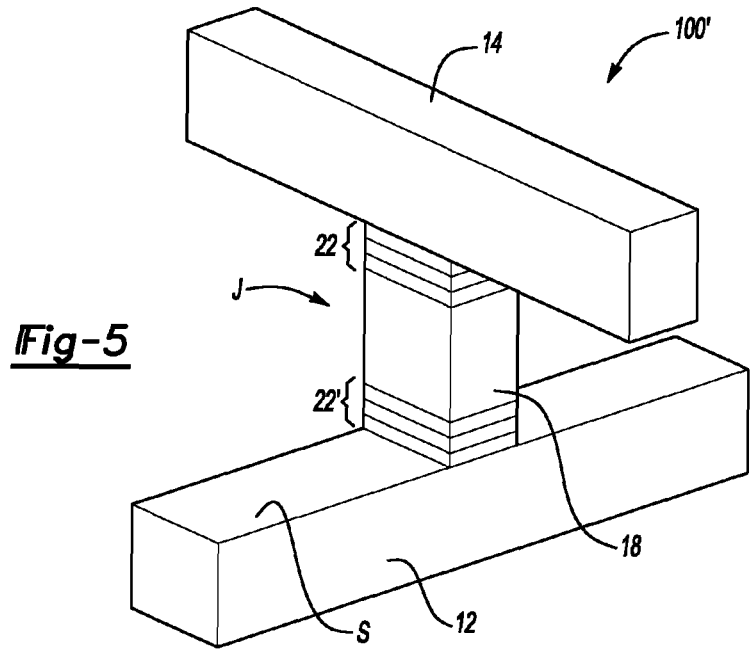
FIG. 5 is a semi-schematic, perspective view of still another embodiment of the memristive device formed, for example, via the embodiment of the method shown in FIG. 3.
Figure 6:
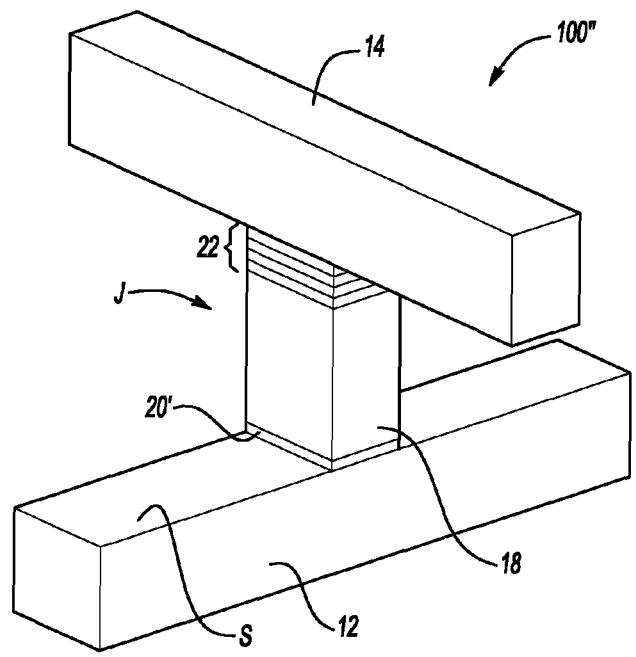
FIG. 6 is a semi-schematic, perspective view of yet another embodiment of the memristive device formed, for example, via the embodiment of the method shown in FIG. 3.

FIG. 3 illustrates another embodiment of the method for forming embodiments of the memristive device 100, 100', 100" shown in FIGS. 4, 5, and 6, respectively. As such, FIGS. 3 through 6 will now be referred to together. As illustrated in FIGS. 4 through 6, these embodiments of the device 100, 100', 100" do not include a substrate. It is to be understood, however, that a substrate may or may not be included. Since graphene 20' or graphite 22' is positioned between the electrode 12 and the active region 18, when a substrate is included, such substrate may or may not be a gas blocking layer. When included, the substrate may be selected from the previously described gas blocking substrates, or other insulating or semiconductor materials. Non-limiting examples of other substrate materials include silicon dioxide, silicon nitride, sapphire, glass, or the like. The substrate may also include an insulating layer on a conducting or semiconducting substrate.

As shown at reference numeral 310 of FIG. 3, graphene 20' or graphite 22' is deposited on at least a portion of the electrode 12. Such selective deposition may be accomplished via the growth or transfer printing process previously discussed. Generally, when selective deposition is used to establish the graphene 20' or graphite 22' on the portion of the electrode surface S, the graphene 20' or graphite 22' is positioned such that it is or will be located in the junction J between the electrodes 12, 14. It is to be understood however, that the graphene 20' or graphite 22' may also be deposited along the entire surface S (see, e.g., FIG. 7).

Once the desired graphene 20' or graphite 22' is established on the electrode 12, the active region 18 may be formed via methods and using material previously discussed (see reference numeral 312 of FIG. 3). In the embodiments shown in FIGS. 4 through 6, the defects are generally introduced or formed at an interface near the graphene 20' or graphite 22', or at an interface near subsequently disposed graphene 20 or graphite 22. The other of these interfaces (e.g., near the graphene 20 or graphite 22, or near the graphene 20' or graphite 22') remains substantially void of defects. In the final devices 100, 100', 100", upon application of a suitable voltage for ON switching, the defects drift towards which ever interface is substantially void of defects, thereby creating localized conductance channels across the active region 18. For OFF switching, the opposite voltage polarity is applied and the defects retreat from that interface to switch the device 10 to a high resistance state.

These embodiments of the device 100, 100', 100" also include the graphene 20 or graphite 22 disposed on the formed active region 18 (see reference numeral 314 of FIG.

3). This second or additional graphene 20 or graphite 22 may be deposited via methods previously described.

Once the graphene 20 or graphite 22 is established, the electrode 14 is positioned thereon at some desirable angle that is non-parallel to the orientation of the bottom/first electrode 12 (see, e.g., reference numeral 316 of FIG. 3).

As illustrated in FIGS. 4 through 6, any combination of graphene 20' or graphite 22' between the electrode 12 and the active region 18, and graphene 20 or graphite 22 between the active region 18 and the electrode 14 may be used. For example, graphene 20' and 20 may be used at both interfaces (see FIG. 4), graphite 22' and 22 may be used at both interfaces (see FIG. 5), or graphene 20' or 20 may be used at one interface while graphite 22 or 22' is used at the other interface (see FIG. 6).

FIG. 4 also illustrates the addition of another layer 28 positioned on at least some of the sides of the active region 18 that remain exposed. It is to be understood that these layers 28 may also be disposed on all of the exposed sides of the active region 18, and may be included in any of the embodiments disclosed herein. Non-limiting examples of such layers 28 include low dielectric constant materials (i.e., at least lower than the dielectric constant of the active region 18 material (e.g., $TiO_2$ has a dielectric constant of 30), and in some instances lower than the dielectric constant of $SiO_2$, which is 3.9), such as silicon carbon nitride (SiCN). It is to be further understood that since the embodiments of active region 18 of the devices 10, 100, 100', 100" are thin (e.g., 10 nm or less), the gas interaction taking place at such sides is minimal and thus will not deleteriously affect the performance of the device 10, 100, 100', 100". However, when the layers 28 are included, the timing for addition of such layers 28 depends upon the specific processing design. It is to be understood that such layers 28 may be added before the active region 18 material is formed or after the active region 18 material is formed. When added after the active region 18, the layers 28 may be formed via plasma enhanced chemical vapor deposition (PECVD). Other non-limiting examples of suitable techniques for forming the layers 28 after the active region 18 has been formed may include ALD, sputtering, chemical vapor deposition (CVD), or other similar deposition techniques. When the layers 28 are added before the active region 18 is formed, the material for the layers 28 is deposited (e.g., using any of the previously listed techniques) as blanket layers. The blanket layers are patterned (e.g., using an etch mask) to identify the portions that will become the side layers 28, and then the material in the region that will become the active region 18 is etched away. The side layers 28 remain after etching, and the desired material is deposited (in one or more gaps resulting from etching) to fill in the active region(s) 18 at desired locations (e.g., between two side layers 28). It is to be understood that the etchant used is selective to the layers 28, while not deleteriously affecting the underlying electrode 12.

Figure 7:
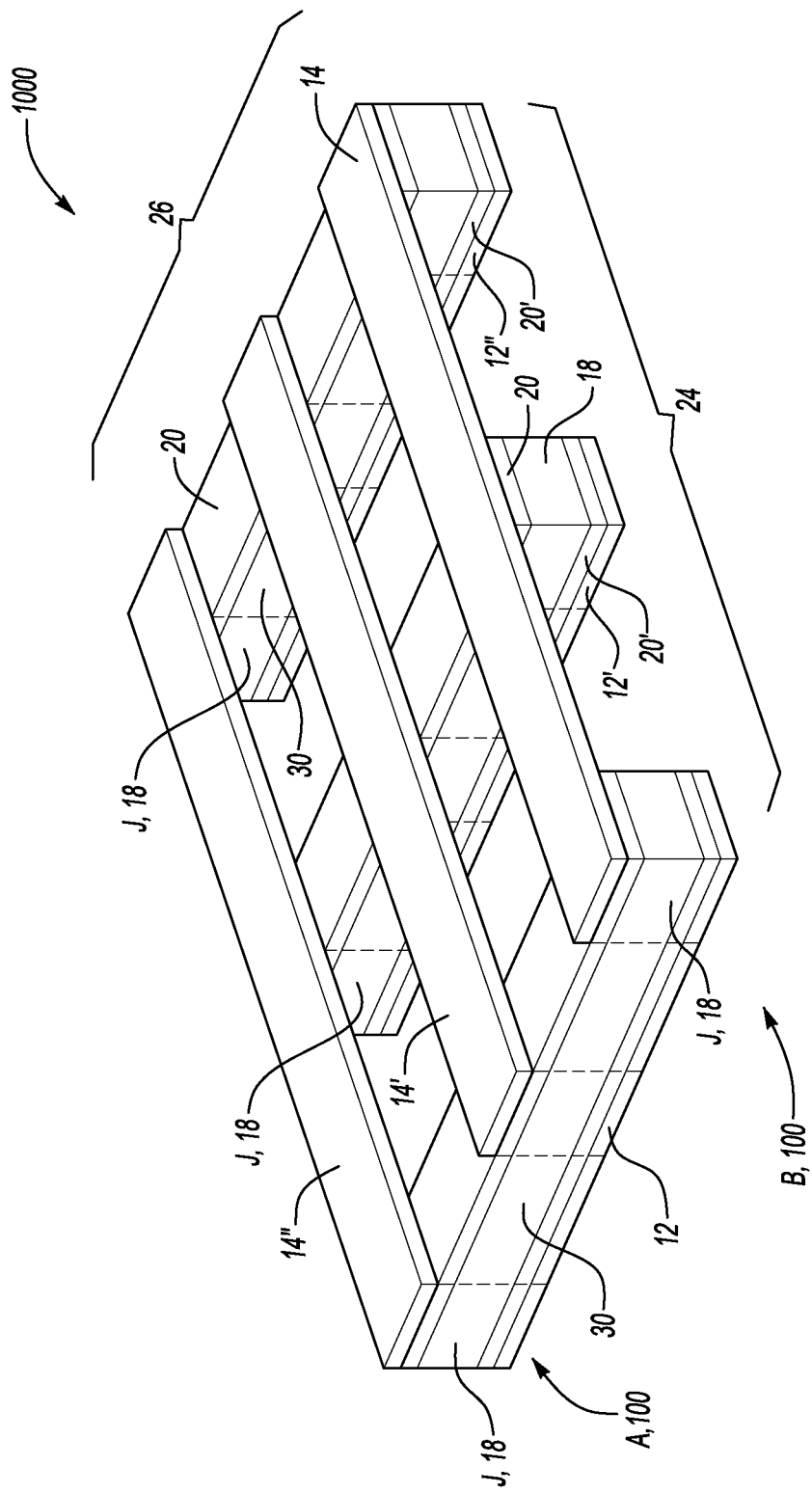
FIG. 7 is a semi-schematic, perspective view of a crossbar array including a plurality of the memristive devices shown in FIG. 4.

Referring now to FIG. 7, a crossbar array 1000 is depicted including a plurality of the memristive devices 100 (two of which are also labeled A and B). It is to be understood that the materials described herein may be used in the memristive devices 100 of the crossbar array 1000. It is to be understood that any of the embodiments of the device 10, 100, 100', and 100" may be included in a crossbar array.

Generally, the crossbar 1000 is an array of switches wherein each member in one set 24 of parallel electrodes 12, 12', 12" connects to every member of a second set 26 of parallel electrodes 14, 14', 14" that intersects the first set 24. In many instances, the two sets 24, 26 of electrodes 12, 12', 12", 14, 14', 14" are perpendicular to each other. However, this is not a necessary condition, and the two sets 24, 26 of electrodes 12, 12', 12", 14, 14', 14" may be offset at any non-zero angle. It is to be understood that each of the junctions J (i.e., cross-points) in the crossbar 1000 includes a respective active region 18 having defects therein.

Each of the active regions 18 is individually addressable after initial fabrication by virtue of the respective electrodes 12, 12', 12", 14, 14', 14" being in selective electrical contact with the respective active region 18. For example, if electrodes 12 and 14" are addressed with an appropriate voltage and polarity, memristive device A, 100 is activated and switched to either the ON state or the OFF state, and if electrodes 12 and 14 are addressed with an appropriate voltage and polarity, memristive device B, 100 is activated and switched to either the ON state or the OFF state. In the array 1000, it is to be understood that when one or more individual devices 10 are addressed, the materials 30 (e.g., additional active region 18 material) positioned adjacent to the junction J (i.e., not in the junction J) remain inactive, as essentially no voltage is applied therebetween (e.g., a voltage is not directly applied to such areas, however, some current may leak into such areas).

For any of the embodiments of the device 10, 100, 100', 100" disclosed herein, the lack or substantial void of defects at an interface near one of the electrodes 12, 14 or near the graphene 20, 20' and/or graphite 22, 22' generates a tunneling barrier or gap, which blocks current flow between the electrodes 12, 14. This constitutes an OFF state. When in the OFF state, one interface in the device 10, 100, 100', 100" contains defects and is an ohmic-like contact, and the other interface contains no defects and is a non-ohmic, or Schottky, contact. The tunneling barrier limits the electronic transport across the junction J until a voltage that exceeds the threshold field for the drift of the defects is applied to the device 10, 100, 100', 100". In the OFF state, the active region 18 is essentially intrinsic, i.e., there are a controlled small number of defects in the lattice. In such instances, the interface contact governs the electrical transport of the junction J. In the OFF state, a positive voltage may be applied, which tends to release gas to the environment. As such, during OFF switching, the presence of the graphene 20, 20' and/or graphite 22, 22' (and in some instance the gas blocking substrate 16) reduces the interaction of the active region 18 material with the environment, and thus reduces or eliminates the release of gas.

Upon application of a suitable voltage, the defects drift towards the non-ohmic interface, thereby creating localized conductance channels across the active region 18. This shunts the electronic tunneling barrier at the non-ohmic interface and turns the device ON. In the ON state, a negative voltage may be applied, which tends to absorb gas from the environment. As such, during ON switching, the presence of the graphene 20, 20' and/or graphite 22, 22' (and in some instance the gas blocking substrate 16) reduces the interaction of the active region 18 material with the environment, and thus reduces or eliminates the absorption of gas.

The opposite electric field pushes the defects back toward the ohmic interface and restores the electronic tunneling barrier at the interface between the active region 18 and one of the electrodes 12, 14 or between the active region 18 and the graphene 20, 20' and/or graphite 22, 22'. It is to be understood that the rectification orientation of the device 10, 100, 100', 100" in its initial state determines the switching polarity of the device 10, 100, 100', 100".

In any of the embodiments disclosed herein, it is to be understood that the electrode 12, the active region 18, and the graphene and/or graphite layers 20, 20', 22, 22' may be blanket layers with the electrode 14 being configured as a smaller layer which defines the location of the junction J.

It is to be understood that the ranges provided herein include the stated range and any value or sub-range within the stated range. For example, a length of about 1 nm to about 20 nm should be interpreted to include not only the explicitly recited limits of about 1 nm to about 20 nm, but also to include individual lengths, such as 2 nm, 3 nm, 4 nm, etc., and sub-ranges, such as 5 nm to 10 nm, 12 nm to 15 nm, etc.

While several embodiments have been described in detail, it will be apparent to those skilled in the art that the disclosed embodiments may be modified. Therefore, the foregoing description is to be considered exemplary rather than limiting.

What is claimed is:

1. A memristive device, comprising:
 a first electrode selected from the group consisting of gold, platinum, tungsten, copper, titanium nitride, and tantalum nitride;
 a second electrode crossing the first electrode at a non-zero angle;
 an active region disposed in direct contact with the first electrode and between the first and second electrodes, the active region having defects therein, wherein the active region is selected from the group consisting of an oxide, a nitride, and a sulfide, and wherein the defects are respectively selected from the group consisting of oxygen vacancies, nitrogen vacancies, and sulfur vacancies; and
 graphene or graphite disposed between the active region and the second electrode.

2. The memristive device as defined in claim 1 wherein the graphite is included in the memristive device, and wherein the graphite includes up to twenty monolayers of graphene.

3. The memristive device as defined in claim 1, further comprising a gas blocking substrate upon which the first electrode is disposed.

4. The memristive device as defined in claim 3 wherein the gas blocking substrate is selected from a silicon wafer having a silicon dioxide oxide layer disposed thereon, aluminum oxide, strontium titanate, magnesium oxide, and combinations thereof.

5. The memristive device as defined in claim 1 wherein the device is a two-terminal device.

6. A crossbar array, comprising:
 a first set of at least two parallel electrodes, the electrodes in the first set each being selected from the group consisting of gold, platinum, tungsten, copper, titanium nitride, and tantalum nitride;
 a second set of at least two parallel electrodes crossing the first set of at least two parallel electrodes at a non-zero angle;
 a junction formed at each point where one of the at least two parallel electrodes in the first set crosses one of the at least two parallel electrodes in the second set;
 an active region disposed in each junction and in direct contact with each of the electrodes in the first set, the active region having defects therein, wherein the active region is selected from the group consisting of an oxide, a nitride, and a sulfide, and wherein the defects are respectively selected from the group consisting of oxygen vacancies, nitrogen vacancies, and sulfur vacancies; and
 graphene or graphite disposed in each junction between the active region and the electrodes in the second set.

7. The crossbar array as defined in claim 6 wherein the graphite is included in the crossbar array, and wherein the graphite has a thickness up to 8 nm.

8. The crossbar array as defined in claim 6, further comprising a gas blocking substrate upon which the first set of electrodes is disposed.

9. The crossbar array as defined in claim 8 wherein the gas blocking substrate is selected from a silicon wafer having a silicon dioxide layer disposed thereon, aluminum oxide, magnesium oxide, strontium titanate, and combinations thereof.

10. A method for making a memristive device, the method comprising:
 depositing an active region material having defects therein on at least a portion of and in direct contact with a first electrode selected from the group consisting of gold, platinum, tungsten, copper, titanium nitride, and tantalum nitride, wherein the active region is selected from the group consisting of an oxide, a nitride, and a sulfide, and wherein the defects are respectively selected from the group consisting of oxygen vacancies, nitrogen vacancies, and sulfur vacancies;
 depositing graphene or graphite on at least a portion of the active region material; and
 disposing a second electrode on the graphene or the graphite such that the second electrode crosses the first electrode at a non-zero angle.

11. The method as defined in claim 10 wherein prior to depositing the active region material, the method further comprises disposing the first electrode on a gas blocking substrate selected from a silicon wafer having a silicon dioxide oxide layer disposed thereon, aluminum oxide, strontium oxide, and magnesium oxide.

12. The method as defined in claim 10 wherein depositing the graphene or the graphite is accomplished via a growth process or a transfer nanoimprinting process.

* * * * *